United States Patent
Ohno et al.

(10) Patent No.: US 6,814,766 B2
(45) Date of Patent: Nov. 9, 2004

(54) POLISHING COMPOSITION AND POLISHING METHOD EMPLOYING IT

(75) Inventors: Koji Ohno, Aichi (JP); Kenji Sakai, Aichi (JP); Katsuyoshi Ina, Aichi (JP)

(73) Assignee: Fujimi Incorporated, Nishikasugai-gun (JP)

( * ) Notice: Subject to any disclaimer, the term of this patent is extended or adjusted under 35 U.S.C. 154(b) by 37 days.

(21) Appl. No.: 10/214,176

(22) Filed: Aug. 8, 2002

(65) Prior Publication Data

US 2003/0084815 A1 May 8, 2003

(30) Foreign Application Priority Data

Aug. 9, 2001 (JP) .......................................... 2001-242235

(51) Int. Cl.[7] .............................. C09G 1/02; C09G 1/04; B24B 1/00
(52) U.S. Cl. .............................. 51/308; 106/3; 438/692; 438/693
(58) Field of Search ............................... 51/308; 106/3; 438/692, 693; 216/89, 96, 99, 100, 101, 108

(56) References Cited

U.S. PATENT DOCUMENTS

| | | |
|---|---|---|
| 5,527,423 A | 6/1996 | Neville et al. |
| 5,958,228 A | 9/1999 | Tokushima et al. |
| 5,993,686 A * | 11/1999 | Streinz et al. ............. 252/79.3 |
| 6,001,269 A | 12/1999 | Sethuraman et al. |
| 6,063,306 A * | 5/2000 | Kaufman et al. .......... 252/79.4 |
| 6,117,783 A | 9/2000 | Small et al. |
| 6,313,039 B1 | 11/2001 | Small et al. |
| 6,328,774 B1 | 12/2001 | Shemo et al. |
| 6,332,831 B1 | 12/2001 | Shemo et al. |
| 6,440,186 B1 | 8/2002 | Sakai et al. |
| 6,579,153 B2 * | 6/2003 | Uchikura et al. ............. 451/41 |
| 2003/0194879 A1 * | 10/2003 | Small et al. ................ 438/753 |

FOREIGN PATENT DOCUMENTS

| | | |
|---|---|---|
| EP | 0 811 665 | 12/1997 |
| WO | WO 96/16436 | 5/1996 |
| WO | WO 98/04646 | 2/1998 |
| WO | WO 01/21724 | 3/2001 |

* cited by examiner

*Primary Examiner*—Michael Marcheschi
(74) *Attorney, Agent, or Firm*—Oblon, Spivak, McClelland, Maier & Neustadt, P.C.

(57) ABSTRACT

A polishing composition for polishing a semiconductor device having at least a tungsten film and an insulating film, which comprises the following components (a) to (d):

(a) silicon dioxide,
(b) periodic acid,
(c) at least one pH controlling agent selected from the group consisting of ammonia, potassium hydroxide, sodium hydroxide, ammonium periodate, potassium periodate and sodium periodate, and
(d) water.

13 Claims, No Drawings

POLISHING COMPOSITION AND POLISHING METHOD EMPLOYING IT

The present invention relates to a polishing composition to be used for polishing a semiconductor device having a tungsten film and an insulating film, to be used for e.g. substrates for semiconductors, photomasks and various memory hard disks, particularly to a polishing composition useful for planarization of the surface of device wafers in e.g. semiconductor industry, and a polishing method employing such a composition.

More particularly, the present invention relates to a polishing composition which is capable of forming an excellent surface having excellent flatness and no light damage by polishing and not stained with impurities such as iron ions in the polishing of semiconductor devices to which so-called chemical mechanical polishing (hereinafter referred to as "CMP") technology is applied, in the processing of device wafers for the production of semiconductor devices having at least a tungsten film and an insulating film, and a polishing method employing such a composition.

Progress of computer products has been remarkable in recent years, and parts to be used for such products, such as ULSI devices, have been developed for high integration and high speed, year after year. Along with such progress, the design rule for semiconductor devices has been progressively refined year after year, the depth of focus in a process for producing devices tends to be shallow, and planarization required for the pattern-forming surface tends to be increasingly severe.

Further, along with refinement and high integration of devices, wirings on the devices have become increasingly complex, and accordingly, it has been required to stack multilayered wirings on a silicon surface. In a process of stacking the respective layers, it has now become important to maintain flatness of each layer in order to form a wiring of its upper layer with good precision. CMP is used as the most effective means for this planarization. CMP may be generally classified into two types i.e. a method of polishing for planarization of an insulating film of silicon dioxide, silicon nitride, monofluoro silicon oxide or the like, and a method of polishing for planarization of a metal film of tungsten, copper, aluminum, an alloy thereof or other metal.

Among such metal films, a tungsten film is used for a contact wiring of a relatively low layer, as tungsten is excellent in heat resistance and stability. For CMP against tungsten, a method has been employed in many cases wherein a tungsten film is polished and removed with a polishing composition comprising abrasive grains such as silica or alumina, an oxidizing agent such as hydrogen peroxide and a catalyst such as iron ions, and polishing is terminated when the insulating layer appears.

However, when a conventional polishing composition is employed for polishing, due to the presence of impurities such as iron ions, there has been a problem such that light damage is observed on the device surface after polishing, or iron ions are likely to remain attached on a wafer after polishing and deteriorate the characteristics of the semiconductor device. Further, the surface after polishing may have irregularities caused by the difference between the stock removal rate of the tungsten film and the stock removal rate of the insulating layer by the polishing composition, which tends to further worsen the yield of the device.

The present invention has been made to effectively solve the above problems. Namely, it is an object of the present invention to provide a polishing composition which is capable of forming an excellent surface having excellent flatness and no light damage by polishing and not stained with impurities such as iron ions, in the polishing of a semiconductor device having at least a tungsten film and an insulating film.

Further, it is another object of the present invention to provide a polishing method which comprises carrying out the finish polishing by means of the polishing composition of the present invention, after polishing and removing the majority of a tungsten film, in the polishing of a semiconductor device having at least a tungsten film and an insulating film, whereby an excellent surface having excellent flatness and no light damage by polishing, can be formed and staining with impurities such as iron ions, can be prevented.

The polishing composition of the present invention is one for polishing a semiconductor device having at least a tungsten film and an insulating film, which comprises the following components (a) to (d):

(a) silicon dioxide,
(b) periodic acid,
(c) at least one pH controlling agent selected from the group consisting of ammonia, potassium hydroxide, sodium hydroxide, ammonium periodate, potassium periodate and sodium periodate, and
(d) water.

The polishing method of the present invention is such that in a process for polishing a semiconductor device having at least a tungsten film and an insulating film, it comprises polishing the tungsten film and the insulating film simultaneously with a polishing composition which comprises the following components (a) to (d):

(a) silicon dioxide,
(b) periodic acid,
(c) at least one pH controlling agent selected from the group consisting of ammonia, potassium hydroxide, sodium hydroxide, ammonium periodate, potassium periodate and sodium periodate, and
(d) water.

Further, the method for polishing a semiconductor device according to the present invention, is such that in a polishing process for production of a semiconductor device having at least a tungsten film and an insulating film, it comprises carrying out the finish polishing with the above-mentioned polishing composition, after removing the majority of the tungsten film.

According to the present invention, in the polishing process for the production of a semiconductor device having at least a tungsten film and an insulating film, the tungsten film and the insulating film can be polished while maintaining substantially the same stock removal rates in the finish polishing step after removing excess tungsten by polishing, and as a result, good flatness can be realized, and a surface having no light damage by polishing and not stained with impurities such as iron ions, can be obtained.

Now, the present invention will be described in detail with reference to the preferred embodiments.

(a) Silicon Dioxide

The polishing composition of the present invention contains silicon dioxide. Silicon dioxide plays a role as an abrasive for mechanical polishing. Silicon dioxide is known to have several crystal forms, and various methods are known also for its production. Any optional one may be employed for the polishing composition of the present invention irrespective of such crystal forms or the production methods. However, among them, it is preferred to use one which can easily be made into fine particles and whereby it is possible to obtain a stabilized aqueous suspension of silicon dioxide.

Specifically, the silicon dioxide to be used in the present invention, is preferably one produced by a sol-gel process. The production of silicon dioxide by a sol-gel process is usually carried out as follows. Namely, methyl silicate is dropwise added into a solvent comprising methanol, ammonia and water, and hydrolyzed to form silicon dioxide. By this method, a suspension of silicon dioxide containing very little purities, can be obtained.

As a method for producing silicon dioxide other than the sol-gel process, a method for the production by heating silicon tetrachloride, or a method of ion exchanging sodium silicate to grow silicon dioxide, may be mentioned. However, by the method of using silicon tetrachloride as the starting material, a very small amount of chlorine is likely to be included as an impurity in the resulting silicon dioxide. Further, in the method of employing sodium silicate as the starting material, it is common that the starting material contains metal impurities such as alkaline earth metals, copper, iron and chromium. Accordingly, in a case where silicon dioxide produced by such a method, is to be used, it is preferred to carry out purification treatment to remove the impurities.

The content of silicon dioxide in the polishing composition of the present invention is usually within a range of from 10 to 200 g/l, preferably within a range of from 30 to 150 g/l, with a view to presenting a sufficient mechanical polishing power to the polishing composition, dispersing it uniformly and stably in the polishing composition and maintaining a proper viscosity. When the content of silicon dioxide is within the above range, the stock removal rates of the tungsten film and the insulating film can be made adequate with a sufficient mechanical polishing power, and it is possible to shorten the polishing time. Further, when the content of silicon dioxide is within the above range, the stability of the dispersion of silicon dioxide in the polishing composition can be maintained properly, and it is possible to prevent that the precipitation of silicon dioxide or the viscosity of the polishing composition, tends to be excessive.

Further, the size of the silicon dioxide in the present invention is usually within a range of from 40 to 120 nm, preferably within a range of from 60 to 100 nm, as an average particle size (hereinafter referred to as a surface area-based particle size) calculated from the surface area measured by a BET method (nitrogen-adsorption method) and the surface area calculated from the density of the particles. Further, it is usually within a range of from 80 to 300 nm, preferably within a range of from 150 to 250 nm, as an average particle size (hereinafter referred to as an optical particle size) measured by an optical scattering method by an optical particle size measuring apparatus. When the particle size of the silicon dioxide is within this range, the mechanical polishing power can be made to be adequate, a high stock removal rate can be accomplished especially of the insulating film, and it is possible to prevent a too much increase of the viscosity of the polishing composition. Further, when the particle size of the silicon dioxide is within the above range, the silicon dioxide can be dispersed uniformly, and precipitation of particles can be prevented. As a result, light damage on the surface after polishing can be prevented.

(b) Periodic Acid

The polishing composition of the present invention contains periodic acid. Periodic acid is well known as a material which has an oxidizing effect. Periodic acid contained in the polishing composition of the present invention is one which imparts an oxidizing effect to the polishing composition. This oxidizing effect is effective mainly against the tungsten film and changes the tungsten on the surface to tungsten trioxide ($WO_3$). This oxidized tungsten trioxide is a brittle material and tends to be readily removed by the mechanical polishing effect by the above-mentioned silicon dioxide.

The content of periodic acid in the polishing composition of the present invention is usually within a range of from 2 to 9 g/l, preferably within a range of from 3.5 to 6 g/l. When the content of periodic acid in the polishing composition of the present invention is within the above range, the oxidizing effect against the tungsten film will be proper, and the stock removal rate can also be maintained at a proper level. Further, against a pH change due to the addition of the periodic acid, the pH adjustment, which will be described hereinafter, is also easy.

(c) pH Controlling Agent

The polishing composition of the present invention contains at least one pH controlling agent selected from the group consisting of ammonia, potassium hydroxide, sodium hydroxide, ammonium periodate, potassium periodate and sodium periodate. Such a pH controlling agent is added to adjust the pH of the polishing composition. The pH of the polishing composition of the present invention is adjusted usually within a range of from 4.5 to 7, preferably from 5 to 6, more preferably from 5.3 to 5.8, by the addition of the above pH controlling agent. If the pH is within this range, the oxidizing effect by periodic acid will sufficiently be performed, and the stock removal rate of the tungsten film by the polishing composition can be maintained sufficiently and properly, and there will be no problem from the viewpoint of regulations, and safety and hygiene.

(d) Water

The polishing composition of the present invention contains water as a medium. The water to be used for the polishing composition of the present invention may be any one of industrial water, city water, deionized water and distilled water, but is preferably one containing substantially no metal ions. It is particularly preferred to employ one obtained by subjecting deionized water containing substantially no metal ions to filtration to remove foreign matters.

Polishing Composition

The polishing composition of the present invention is one which is useful for the production of semiconductor devices. As generally known, semiconductor devices may have their performance deteriorated by inclusion of metal impurities. Further, elements of certain types tend to deposit on the surface of silicon dioxide contained in the polishing composition and thus cause light damage by polishing on the wafer surface. In the polishing composition of the present invention, the contents of such elements (hereinafter referred to as impurity elements) are preferably low in order to improve the yield in the process for producing semiconductor. Such impurity elements include elements of Groups 2A, 3A, 4A, 5A, 6A, 7A, 8A, 1B and 2B, lanthanoids, actinoids, aluminum, gallium, indium, thalium, tin, lead, bismuth, fluorine and chlorine. The concentration of each of them is preferably not more than 100 ppb, more preferably not more than 50 ppb.

The concentrations of these impurities can be measured by commonly employed analytical apparatus, such as an inductively coupled plasma mass spectrometric apparatus (ICM-MS), an inductively coupled plasma spectrometric apparatus (ICP spectrometric apparatus) or an atomic absorption spectrometric apparatus. Further, ion chromatography or the like, may be employed for the measurement of fluorine and chlorine.

Further, the above-mentioned impurity elements adversely affect also the storage stability of the polishing composition. Namely, if impurities are present in a large amount in the polishing composition, it is possible that by such impurities, periodic acid as a component of the polishing composition of the present invention, will be decomposed. Accordingly, when the content of such impurity elements is low, the polishing composition of the present invention is able to exhibit excellent storage stability.

With the polishing composition of the present invention, for at least one month after the preparation, the stock removal rates of the tungsten and the insulating film, are maintained to be at least 90% of the stock removal rates immediately after the preparation.

The polishing composition of the present invention can be used also for the finish polishing wherein the tungsten film and the insulating film are simultaneously polished. Accordingly, it is preferably capable of polishing the tungsten film and the insulating film at substantially the same levels of the stock removal rates. Thus, the ratio (hereinafter referred to as the selection ratio) of the stock removal rate of the insulating film to the stock removal rate of the tungsten film, is preferably within a range of from 0.75 to 1.5, more preferably within a range of from 0.9 to 1.2. By adjusting the selection ratio within this range, the tungsten film and the insulating film can uniformly be polished, and the flatness of the finished surface by final polishing will be improved.

In the field of semiconductor devices, there are several types of films which are so-called insulating films. Specifically, a silicon oxide film (commonly a TEOS film) formed by a CVD method, a monofluoro silicon oxide film (commonly a SiOF film), a boron-doped BSG film, a phosphorus-doped PSG film, and a boron- and phosphorus-doped BPSG film may, for example, be mentioned. These films are different in the mechanical strength depending upon the types, and accordingly, the stock removal rates by a polishing composition vary depending upon the types. Therefore, various components in the polishing composition should be adjusted to optimize the selection ratio. Further, the stock removal rate of the tungsten film may also vary depending upon the condition for forming the tungsten film, and accordingly, the composition of the polishing composition should be optimized depending upon the construction of the object to be polished.

The polishing composition of the present invention is prepared usually by mixing, dissolving or dispersing silicon dioxide, periodic acid and the pH controlling agent in water, and, if necessary, further dissolving other additives. The method for dispersing or dissolving these components in water, is optional. For example, they are dispersed by stirring a vane-type stirrer or ultrasonic wave dispersion. Further, the order of addition of these components is also optional, i.e. any component may be dispersed and dissolved first, or they may be added simultaneously.

With respect to the supply form of the polishing composition of the present invention, (a) the silicon dioxide, (b) the periodic acid, (c) the pH controlling agent and (d) the water may be mixed beforehand, and such a mixture may be used as it is, for polishing. However, a concentrated polishing composition containing the above components (a), (b) and (c) in high concentration, may be prepared, and at the time of use, it may be diluted to obtain the desired composition. Otherwise, the composition may be prepared as divided into two or more liquids. For example, it may be prepared as divided into two liquids i.e. a first liquid comprising (a) silicon dioxide and (d) water, and a second liquid comprising (b) periodic acid, (c) a pH controlling agent and (d) water, and at the time of use, these two liquid compositions may be mixed for use. In this way, it is possible to finely adjust the selection ratio by finely adjusting the proportions of the two liquid compositions depending upon the types of the insulating film and the tungsten film, the state of the polishing machine, the environment at the time of polishing, etc. Further, from the viewpoint of the storage stability, it is advantageous to divide the composition into two liquids.

Polishing Method

The polishing method of the present invention comprises polishing a semiconductor device having at least a tungsten film and an insulating film with the above-mentioned polishing composition.

The polishing method of the present invention may be combined with any conventional polishing method or polishing conditions, so long as a semiconductor device having at least a tungsten film and an insulating film is polished by means of the above polishing composition.

For example, as the polishing machine, one side polishing machine, both sides polishing machine or other polishing machine may be used. Further, as a polishing pad, a suede type, a non-woven fabric type, a flocked fabric type or a raised fabric type may, for example, be employed.

In the polishing of semiconductor devices, in order to make the surface more flat, polishing may be carried out in two or more steps. In such multi-steps polishing, in the initial polishing, polishing is carried out at a high speed even if some defects remain on the polished surface formed, and in a later polishing, a flat polished surface is formed by mending the defects. In the present invention, the above-mentioned polishing composition has a selection ratio of about 1, and it is preferably employed for the final polishing step i.e. the finish polishing, in polishing in two or more steps. In such a case, in a polishing step prior to the final polishing, it is preferred that the majority of the tungsten film is removed. Here, "the majority of the tungsten film is removed" means that polishing has been done to such a thickness that the remaining tungsten film is not more than 2,000 Å, preferably not more than 1,000 Å. The method for obtaining a semiconductor device having the majority of the tungsten film so removed, is optional, but the above-mentioned polishing composition or a commonly employed other polishing composition, may be employed.

Now, the present invention will be described in further detail with reference to Examples. However, it should be understood that the present invention is by no means restricted to such specific Examples.

TEST 1

Content and Preparation of Polishing Composition

The respective components i.e. silicon dioxide, periodic acid and ammonia were dissolved or dispersed in water, to prepare polishing compositions of Examples 1 to 24 and Comparative Examples 1 to 3. The concentrations or the added amounts of the respective components are as shown in Table 1. In each of Examples and Comparative Examples, silicon dioxide used, was a colloidal silica purified by a sol-gel method and having a surface area-based particle size of 90 nm and an optical particle size of 230 nm. The contents of the impurity elements were at most 50 ppb each.

In Examples 1 to 7 and Comparative Example 3, the concentration of silicon dioxide was varied, while other components were kept to be constant. In Examples 8 to 13 and Comparative Example 2, the amount of periodic acid was changed, while other components were kept to be constant. Further, in Examples 14 to 19 and Comparative Example 1, the amount of ammonia was changed, while other components were kept to be constant. Comparative Example 1 is an Example wherein no ammonia was added, i.e. no adjustment of the pH was carried out. Further, in Examples 22 to 24, as the compound to adjust the pH, potassium hydroxide, ammonium periodate and potassium periodate, were used, respectively, while other components were kept to be constant.

Evaluation of the stock removal rates were carried out by using tungsten and TEOS blanket wafers. The thicknesses of the tungsten film and the TEOS film before and after the polishing were measured, and the stock removal rates were calculated from the differences in thickness as between before and after the polishing. For the measurement of the thickness of the tungsten film, a sheet resistor (VR-120, manufactured by Kokusai Denki System Service K.K.) was

TABLE 1

|  | Silicon dioxide g/l | Periodic acid g/l | pH controlling agent | pH | Stock removal rate W Å/min | TEOS Å/min | Stock removal rate ratio |
| --- | --- | --- | --- | --- | --- | --- | --- |
| Ex. 1 | 5 | 4 | Ammonia | 5.5 | 270 | 350 | 1.30 |
| Ex. 2 | 10 | 4 | Ammonia | 5.5 | 320 | 400 | 1.25 |
| Ex. 3 | 30 | 4 | Ammonia | 5.5 | 480 | 550 | 1.15 |
| Ex. 4 | 70 | 4 | Ammonia | 5.5 | 800 | 870 | 1.09 |
| Ex. 5 | 150 | 4 | Ammonia | 5.5 | 1200 | 1300 | 1.08 |
| Ex. 6 | 200 | 4 | Ammonia | 5.5 | 1350 | 1500 | 1.11 |
| Ex. 7 | 250 | 4 | Ammonia | 5.5 | 1450 | 1600 | 1.10 |
| Ex. 8 | 70 | 1 | Ammonia | 5.5 | 500 | 870 | 1.74 |
| Ex. 9 | 70 | 2 | Ammonia | 5.5 | 610 | 880 | 1.44 |
| Ex. 10 | 70 | 3.5 | Ammonia | 5.5 | 750 | 890 | 1.19 |
| Ex. 11 | 70 | 6 | Ammonia | 5.5 | 970 | 900 | 0.93 |
| Ex. 12 | 70 | 9 | Ammonia | 5.5 | 1220 | 910 | 0.75 |
| Ex. 13 | 70 | 10 | Ammonia | 5.5 | 1350 | 910 | 0.67 |
| Ex. 14 | 70 | 4 | Ammonia | 3.0 | 500 | 1900 | 3.80 |
| Ex. 15 | 70 | 4 | Ammonia | 4.0 | 600 | 1400 | 2.33 |
| Ex. 16 | 70 | 4 | Ammonia | 4.5 | 650 | 1250 | 1.92 |
| Ex. 17 | 70 | 4 | Ammonia | 5.0 | 720 | 1080 | 1.50 |
| Ex. 18 | 70 | 4 | Ammonia | 5.3 | 780 | 930 | 1.19 |
| Ex. 19 | 70 | 4 | Ammonia | 5.8 | 850 | 780 | 0.92 |
| Ex. 20 | 70 | 4 | Ammonia | 6.0 | 900 | 700 | 0.78 |
| Ex. 21 | 70 | 4 | Ammonia | 7.0 | 1100 | 500 | 0.45 |
| Ex. 22 | 70 | 4 | KOH | 5.5 | 820 | 890 | 1.09 |
| Ex. 23 | 70 | 2 | API *[1] | 5.3 | 830 | 950 | 1.14 |
| Ex. 24 | 70 | 2 | PPI *[2] | 5.5 | 850 | 1020 | 1.20 |
| Comp. Ex. 1 | 70 | 4 | — | 1.3 | 300 | 2700 | 9.00 |
| Comp. Ex. 2 | 70 | — | Ammonia | 9.0 | 200 | 1300 | 6.50 |
| Comp. Ex. 3 | — | 4 | Ammonia | 5.0 | 180 | 30 | 0.17 |

API *[1]Ammonium periodate
PPO *[2]Potassium periodate

Polishing Tests

Then, polishing tests were carried out using the polishing compositions of Examples 1 to 24 and Comparative Examples 1 to 3. The polishing conditions were as follows.

| Polishing conditions | |
| --- | --- |
| Polishing machine: | One side CMP polishing machine (Mirra, manufactured by Applied Materials Inc.) |
| Object to be polished: | Tungsten blanket wafer (8 inch silicon wafer having a tungsten film formed by a PVD method) TEOS blanket wafer (8 inch silicon wafer having a TEOS film formed by a CVD method) |
| Polishing pad: | laminated polishing pad made of polyurethane (IC-1000/Suba 400, manufactured by Rodel Inc.) |
| Polishing pressure: | 4 psi (about 28 kPa) |
| Polishing time: | 60 seconds |
| Platen rotational speed: | 70 rpm |
| Supply rate of the polishing composition: | 250 cc/min |
| Carrier rotational speed: | 70 rpm | used, and for the measurement of the thickness of the TEOS film, an optical abdominal pressure meter (VM-2030, manufactured by Dai Nippon Screen Mfg Co., Ltd.) was used. Further, a value obtained by dividing the stock removal rate of the TEOS film by the stock removal rate of the tungsten film, is indicated as a selection ratio.

After the polishing, by means of an optical microscope, the state of the tungsten surface was visually evaluated.

Further, metal impurities on the surface after the polishing were measured by means of an elemental analyzer (total reflection X-ray fluorescence type, TRE-610T, manufactured by Technos K.K.). The evaluation results are as shown in Table 1.

Referring to the evaluation results of Test 1, it is evident from the results of Examples 1 to 21 that by changing the amounts of silicon dioxide, periodic acid and ammonia, the stock removal rates of the tungsten film and the TEOS film can be adjusted. Further, from the results of Examples 22 to 24, it is evident that good results of equal levels can be obtained when potassium hydroxide, ammonium periodate or potassium periodate is used instead of ammonia. Comparative Example 1 is an example wherein no adjustment of pH was carried out, whereby the selection ratio was remarkably large, since the stock removal rate of the tungsten film was small as compared with the stock removal rate of the TEOS film. Comparative Example 2 is an example wherein no periodic acid was incorporated, and from the comparison of this Comparative Example 2 with the respective Examples, it is evident that by the incorporation of periodic acid, the stock removal rate of the tungsten is remarkably improved, and the selection ratio can also be substantially improved.

Analyses of element ions on the surface after polishing, were carried out, and with respect to each element, the measured value was such that there was no problem in performance in each of Examples and Comparative Examples. Further, in each of Examples and Comparative Examples, the state of the surface after polishing was good.

TEST 2

To evaluate the influence of metal impurities to the polishing composition of the present invention, the following three types of polishing compositions were prepared. Namely, the polishing composition of Example 4, a composition (Example 25) having iron nitrate added to the polishing composition of Example 4 so that the iron ion concentration would be 150 ppb, and a composition (Example 26) in which instead of the colloidal silica used in Example 4, a colloidal silica prepared by an ion exchange method (a method of purifying from sodium silicate) having the same particle size, was used. Using the above three types of polishing compositions, polishing and evaluation were carried out under the same conditions as in Test 1 with respect to the compositions immediately after the preparation and after storage for one month from the preparation in a sealed state at room temperature. The evaluation results are as shown in Table 2. The content of metal impurities in the colloidal silica prepared by the ion exchange method as used in Example 26, was measured by an inductively coupled plasma mass spectrometry (ICM-MS), and the results are as shown in Table 3.

TABLE 3-continued

| Elements | Contents of impurity metals (ppb) |
|---|---|
| Mn | 100 |
| Mo | <200 |
| Ni | <500 |
| Pb | <500 |
| Sn | <2000 |
| Sr | <100 |
| Ti | 6000 |
| V | <100 |
| Zn | <1000 |
| Zr | <3000 |

The stock removal rates were compared as between immediately after the preparation and after storage for one month, whereby the stock removal rate by the composition of Example 4 did not substantially decrease. Further, in Example 25 and in Example 26, the stock removal rates after the storage tended to decrease. Accordingly, it is evident that the storage stability is better with one wherein metal impurities are less.

The tungsten surface after polishing was inspected, and with the polishing composition of Example 4, no light damage by polishing was observed, while in Examples 25 and 26, light damage was observed. Thus, it was found that the light damage tends to increase as the metal impurities increase. Further, metal impurities on the surface after polishing were measured, whereby with the polishing composition of Example 4, each element was below the detection limit, but in Example 25, $4 \times 10^{10}$ atoms/cm$^2$ of iron ions were detected. Further, in Example 26, due to the influence of metal impurities contained in the silica, on the surface after polishing, iron ions were detected at a concentration of $2 \times 10^{11}$ atoms/cm$^2$, and titanium ions were detected at a concentration of $3 \times 10^{11}$ atoms/cm$^2$.

From the results of Test 2, it was found that when a polishing composition containing metal impurities, is used, staining with metal impurities tends to be observed on the device surface after the polishing. Further, a mechanism is assumed such that by the metal impurities, decomposition of periodic acid takes place, and the polishing composition changes during the storage for a long period of time, whereby the stock removal rate decreases.

TABLE 2

| | Silicon dixide | Addition of iron nitrate | Iron ion concentration on the surface (atoms/cm$^2$) | pH | Stock removal rate immediately after the preparation W Å/min | TEOS Å/min | Stock removal rate ratio | pH | Stock removal rate after storage for one month at room temperature W Å/min | TEOS Å/min | Stock removal rate ratio |
|---|---|---|---|---|---|---|---|---|---|---|---|
| Ex. 4 | Sol-gel process | No | <1 × 10$^{10}$ | 5.5 | 800 | 870 | 1.09 | 5.5 | 790 | 870 | 1.10 |
| Ex. 25 | Sol-gel process | Yes | 4 × 10$^{10}$ | 5.5 | 810 | 870 | 1.07 | 5.8 | 650 | 870 | 1.34 |
| Ex. 26 | Ion exchange method | No | 2 × 10$^{10}$ | 5.5 | 830 | 890 | 1.07 | 6.0 | 410 | 880 | 2.15 |

TABLE 3

| Elements | Contents of impurity metals (ppb) |
|---|---|
| Al | 15000 |
| Ba | 100 |
| Ca | 10000 |
| Cd | <100 |
| Co | <100 |
| Cr | 1000 |
| Cu | <100 |
| Fe | 13000 |
| Mg | <3000 |

TEST 3

A composition (A) comprising 100 g/l of silicon dioxide and 6 g/l of periodic acid and having the pH adjusted to 4.5 by ammonia, and a composition (B) containing 200 g/l of silicon dioxide only, were preliminarily prepared. Here, as the silicon dioxide, a colloidal silica prepared by a sol-gel process, which was the same as one used in Test 1, was used. Then, two types of polishing compositions were prepared i.e. one (Example 27) wherein compositions A and B were mixed in a volume ratio of A:B=2:1, and one (Example 28) wherein they were mixed in a volume ratio of A:B=1:1. Using the polishing compositions of Examples 27 and 28, polishing tests were carried out in the same manner as in Test 1, whereby the respective polishing performance was measured. As a result, in Example 25, the stock removal rate of tungsten was 820 Å/min, and the stock removal rate of the TEOS film was 900 Å/min. Whereas in Example 26, the stock removal rate of tungsten was 750 Å/min, and the stock removal rate of the TEOS film was 700 Å/min. Further, in each of Examples 27 and 28, the conditions of the surface after polishing was good (◎), and the iron ion concentration on the surface after polishing was not more than $1\times10^{10}$ atoms/cm$^2$, i.e. a practically no problematic level.

TEST 4

Further, using a colloidal silica having a surface area-based particle size and an optical particle size as identified in Table 4, as silicon dioxide, a polishing composition having the same composition as in Example 4 was prepared, and polishing tests and evaluation were carried out under the same conditions as in Test 1. The colloidal silicas used were all produced by the sol-gel process, and their contents of impurity elements were not more than 50 ppb with respect to each element. The evaluation results are as shown in Table 4.

TABLE 4

| | Surface area-based particle size (nm) | Optical particle size | Stock removal rate W Å/min | Stock removal rate TEOS Å/min | Stock removal rate ratio |
|---|---|---|---|---|---|
| Ex. 27 | 20 | 100 | 500 | 400 | 0.80 |
| Ex. 28 | 40 | 150 | 650 | 600 | 0.92 |
| Ex. 29 | 60 | 180 | 750 | 730 | 0.97 |
| Ex. 30 | 100 | 220 | 790 | 850 | 1.08 |
| Ex. 31 | 120 | 300 | 800 | 860 | 1.08 |
| Ex. 32 | 140 | 300 | 810 | 880 | 1.09 |
| Ex. 33 | 40 | 60 | 600 | 500 | 0.83 |
| Ex. 34 | 60 | 80 | 650 | 600 | 0.92 |
| Ex. 35 | 70 | 150 | 720 | 750 | 1.04 |
| Ex. 36 | 90 | 250 | 800 | 850 | 1.06 |
| Ex. 37 | 100 | 300 | 820 | 870 | 1.06 |
| Ex. 38 | 120 | 400 | 810 | 860 | 1.06 |

From the results of Test 3, it was found possible to obtain a good surface free from light damage and having a low iron ion concentration, even in a case where the polishing composition is divided into two compositions, which are mixed at the time of polishing. Further, it was found that by changing the blend ratio of the two compositions at the time of polishing, it is possible to adjust the stock removal rates of the tungsten film and the insulating film. Further, from the results of Test 4, it was found that when the surface area-based particle size or the optical particle size of silicon oxide is changed, the stock removal rates of the tungsten film and the insulating film will change, but the results are good with respect to both the surface after polishing and metal impurities.

The entire disclosure of Japanese Patent Application No. 2001-242235 filed on Aug. 9, 2001 including specification, claims and summary are incorporated herein by reference in its entirety.

What is claimed is:

1. A polishing composition for polishing a semiconductive device having at least a tungsten film and an insulating film, which comprises the following components (a) to (d):
   (a) silicon dioxide,
   (b) periodic acid,
   (c) at least one pH controlling agent selected from the group consisting of ammonia, potassium hydroxide, sodium hydroxide, ammonium periodate, potassium periodate and sodium periodate, and
   (d) water,
   wherein the silicon dioxide, periodic acid, at least one controlling agent and water are mixed in amounts effective to process the tungsten and insulative films at substantially the same stock removal rate.

2. The polishing composition according to claim 1, wherein the concentration of each of elements of Groups 2A, 3A, 4A, 5A, 6A, 7A, 8A, 1B an 2B, lantanoids, actinoids, aluminum, gallium, indium, thallium, tin, lead, bismuth, fluorine and chlorine, is not more than 100 ppb in the polishing composition.

3. The polishing composition according to claim 1, wherein the silicon dioxide is silicon dioxide produced by a sol-gel process.

4. The polishing composition according to claim 1, which has a pH of from 4.5 to 7.

5. In a process for polishing a semiconductor device having at least a tungsten film and an insulating film, a polishing method which comprises polishing the tungsten film and the insulating film simultaneously with the polishing composition according to claim 1.

6. The polishing method according to claim 5, wherein the concentration of each of elements of Groups 2A, 3A, 4A, 5A, 6A, 7A, 8A, 1B and 2B, lantanoids, actinoids, aluminum, gallium, indium, thallium, tin, lead, bismuth, fluorine and chlorine, is not more than 100 ppb in the polishing composition.

7. The polishing method according to claim 5, wherein the silicon dioxide is silicon dioxide produced by a sol-gel process.

8. The polishing method according to claim 5, which has a pH of from 4.5 to 7.

9. In a polishing process for production of a semiconductor device having at least a tungsten film and an insulating film, a method for polishing the semiconductor device, which comprises carrying out the finish polishing with a polishing composition as defined in claim 1, after removing the majority of the tungsten film.

10. The polishing composition according to claim 1, wherein the silicon dioxide, periodic acid, at least one controlling agent and water are mixed in amounts effective to process the tungsten and insulative films such that a ratio of stock removal rates is between 0.45 and 3.80.

11. The polishing composition according to claim 10, wherein the ratio of stock removal rates is between 0.75 and 1.5.

12. The polishing composition according to claim 10, wherein the ratio of stock removal rates is between 0.9 and 1.2.

13. The polishing composition according to claim 1, wherein the at least one pH controlling agent is in an amount which produces a pH of between 5 and 7.

* * * * *

UNITED STATES PATENT AND TRADEMARK OFFICE
CERTIFICATE OF CORRECTION

PATENT NO. : 6,814,766 B2
DATED : November 9, 2004
INVENTOR(S) : Koji Ohno et al.

It is certified that error appears in the above-identified patent and that said Letters Patent is hereby corrected as shown below:

Column 12,
Line 15, before "controlling", insert -- pH --.

Signed and Sealed this

Twenty-second Day of February, 2005

JON W. DUDAS
*Director of the United States Patent and Trademark Office*